(12) United States Patent
Hayn

(10) Patent No.: US 6,781,124 B2
(45) Date of Patent: Aug. 24, 2004

(54) PARTICLE DETECTORS

(75) Inventor: Armin Heinz Hayn, Saffron Walden (GB)

(73) Assignee: Leo Electron Microscopy Ltd., Cambridge (GB)

( * ) Notice: Subject to any disclaimer, the term of this patent is extended or adjusted under 35 U.S.C. 154(b) by 0 days.

(21) Appl. No.: 09/927,608

(22) Filed: Aug. 10, 2001

(65) Prior Publication Data

US 2002/0088939 A1 Jul. 11, 2002

(30) Foreign Application Priority Data

Oct. 8, 2000 (GB) ............................................. 0019547

(51) Int. Cl.[7] ............................................. G01N 23/00
(52) U.S. Cl. ....................... 250/310; 250/397; 250/505.1
(58) Field of Search ................................ 250/310, 397, 250/505.1, 441.11

(56) References Cited

U.S. PATENT DOCUMENTS 4,442,355 A * 4/1984 Tamura et al. .............. 250/310
4,596,929 A * 6/1986 Coates et al. ............... 250/310
5,043,583 A * 8/1991 Robinson .................... 250/397
5,485,008 A * 1/1996 Taylor, Jr. ................... 250/310

FOREIGN PATENT DOCUMENTS

WO   WO 98/22971   * 5/1998

* cited by examiner

Primary Examiner—Hai Pham
Assistant Examiner—Lam Nguyen
(74) Attorney, Agent, or Firm—Barnes & Thornburg LLP

(57) ABSTRACT

A charged particle detector is provided for use in an electron microscope. The detector has a chamber for receiving charged particles generated by the interaction between a particle beam generated by the microscope and the sample. The chamber is maintained at at least a partial vacuum and contains an impact responsive sensor for detecting particles incident thereon. An accelerating electrode field is set up in the chamber by one or more electrodes, and the chamber is sealed by an electronically conductive barrier so as to prevent gas leaking into the chamber, whilst being sufficiently thin to enable charged particles to travel across the barrier and thereby be detected by the detector. The electrically conductive barrier enables a very large accelerating voltage to be used without causing discharge through any gaseous medium in the microscope sample chamber.

19 Claims, 3 Drawing Sheets

PARTICLE DETECTORS

FIELD OF THE INVENTION

This invention relates to apparatus for detecting charged particles and in particular to apparatus for detecting charged particles in a gaseous environment. The invention also relates to a scanning electron microscope incorporating such apparatus.

BACKGROUND TO THE INVENTION

There are occasions on which it is necessary to hold specimens in a gaseous environment during imaging in a scanning electron microscope. Examples include imaging of biological or non-conductive specimens. The gaseous environment inhibits the evaporation of moisture from the biological specimens and dissipates surface charges from the nonconductive specimens, which charges would otherwise accumulate to the detriment of image resolution.

Use of a gaseous environment to amplify a secondary electron signal obtained during imaging of a specimen is described in U.S. Pat. No. 4,785,182 (Mancuso et al.), European Patent EP 330 310 (Electroscan Corp.) and PCT Application No. PCT/GB97/03136, in which secondary electrons released by the specimen as a result of interaction with a scanning electron beam are accelerated through the gaseous environment, some of the secondary electrons colliding with the gas molecules making up the gaseous environment. The collisions ionise the gas molecules to release further electrons, some of which collide with other gas molecules to release yet further electrons. The avalanche of electrons released by the ionisation of the gas molecules as a result of such collisions in effect provides the amplification of the secondary electron signal. PCT/GB97/03136 describes apparatus which detects the amplified secondary electron signal by using a photodetector and photomultiplier to detect photons emitted as a result of the collisions of the electrons with gas molecules.

However, as the gas pressure is increased, the strength of the secondary electron signal is reduced since the gas reduces the proportion of the primary beam which reaches the specimen. This correspondingly limits the maximum gas pressure at which the microscope can create an image.

In scanning electron microscopes in which the specimens are held in a substantially evacuated environment during imaging, it is well known to detect the secondary electrons using an Everhard-Thornley detector. In such a detector the secondary electrons are accelerated towards a scintillator to convert them into photons which are transmitted to a photomultiplier.

The Everhard-Thornley detector has been found to be relatively sensitive, but uses a high voltage to establish an electrostatic field in which the secondary electrons are accelerated towards the scintillator. In a gaseous environment, too high a voltage would be sufficient to cause a discharge through the gas.

SUMMARY OF THE INVENTION

According to a first aspect of the invention, there is provided apparatus for detecting charged particles, the apparatus comprising a chamber for receiving said particles and being such that, in use, at least a partial vacuum is maintained in the chamber; an impact responsive sensor for detecting particles incident thereon, at least the part of the sensor on which the particles are incident being situated in the chamber; accelerating means for providing, in the chamber, an electric field for accelerating charged particles therein towards the sensor and electrically conductive barrier means sealing the chamber in such a way as to prevent the passage of gas into the chamber, to allow said partial vacuum to be maintained, the barrier means being sufficiently thin to enable the charged particles to be detected to travel therethrough, and being electrically isolated from the accelerating means so as to be capable of being maintained at a different potential from the latter.

Thus, if the apparatus is used in a gaseous environment, the accelerating means can generate a large electrostatic accelerating field without causing an electrical discharge in the gas in the environment as the barrier means, when connected to a suitable voltage source, prevents a field of the same magnitude passing through the barrier means. The large accelerating field makes the apparatus very sensitive to said particles.

Furthermore, where a secondary electron signal from a specimen in the chamber of a scanning electron microscope is amplified by collisions with gaseous molecules in a gas amplification collision zone, the number of the electrons produced as a result of this process is far greater than the number of photons emitted by the collisions within the gas. Since the apparatus is sensitive to charged particles, such as electrons, it is especially suitable for detecting a gas amplified secondary electron signal. In addition, the apparatus can be used to detect a secondary electron signal generated in a vacuum, since secondary electrons generated under those conditions can be accelerated towards the inlet by the application of a suitable voltage.

Preferably, the accelerating means comprises an electrically conductive member situated on or adjacent the sensor, and means for connecting said member to an accelerating voltage.

Preferably, the sensor comprises a scintillator for emitting light in response to the impact of a charged particle therewith.

Preferably, the scintillator incorporates said electrically conductive member.

The sensor may conveniently comprise an Everhard-Thornley detector.

The barrier means conveniently comprises a membrane of metallic foil, preferably aluminum.

An aluminium foil is both cheap and a good conductor of electricity, making it particularly suitable for use as a membrane. Furthermore, due to the low atomic number of the atoms constituting the foil, electrons with a kinetic energy of about 500 eV may penetrate the thin aluminium foil.

Preferably, the aluminium foil is of a thickness of 7.5 nm.

Preferably, the barrier means further comprises support means which extends across said inlet behind the foil to support the latter against pressure exerted on the membrane by gas outside the chamber.

Preferably, the apparatus further includes an electrically conductive cage mounted in front of, but electrically insulated from, the barrier means, the cage being connectable to an accelerating voltage for drawing particles towards the barrier means, the cage being so constructed as to allow the passage of particles therethrough. Where the apparatus is being used as a secondary electron detector, a positive voltage can be applied to the cage to move the gas amplification collision zone in the specimen chamber towards the apparatus, thus further increasing the sensitivity of the sensor.

The apparatus may to advantage include a pump connected to, and operable to evacuate, the chamber, and preferably includes voltage application means for applying a first accelerating voltage to said electrically conductive member and a second accelerating voltage of the same polarity as, but lower than, the first accelerating voltage, to the barrier means.

Preferably, the voltage application means is also operable to apply to the cage a further voltage, of the same polarity as, but lower than, the second voltage.

The cage may to advantage be part-spherical or ellipsoidal.

The invention also lies in a scanning electron microscope having a sample chamber for holding a sample to be imaged in a gaseous environment, generating means for generating a scanning beam of electrons and directing said beam onto a sample in said sample chamber, wherein said chamber also contains detecting means for detecting secondary electrons emitted by the sample, said detecting means comprising apparatus as hereinabove described.

Preferably, the electrically conductive member and barrier means are connected to a voltage application means for applying a voltage of +10 kV to the member and of 0 to +1 kV to the barrier means.

Preferably, the apparatus includes a cage as hereinabove described, the voltage application means being operable to apply a voltage of approximately +300 volts thereto.

The apparatus can be used when there are substantially no gases in the sample chamber since the secondary electrons from the sample will be accelerated towards the barrier means.

BRIEF DESCRIPTION OF THE DRAWINGS

The invention will now be described, by way of example only, with reference to the accompanying drawings, in which.

DETAILED DESCRIPTION

Figure 1:
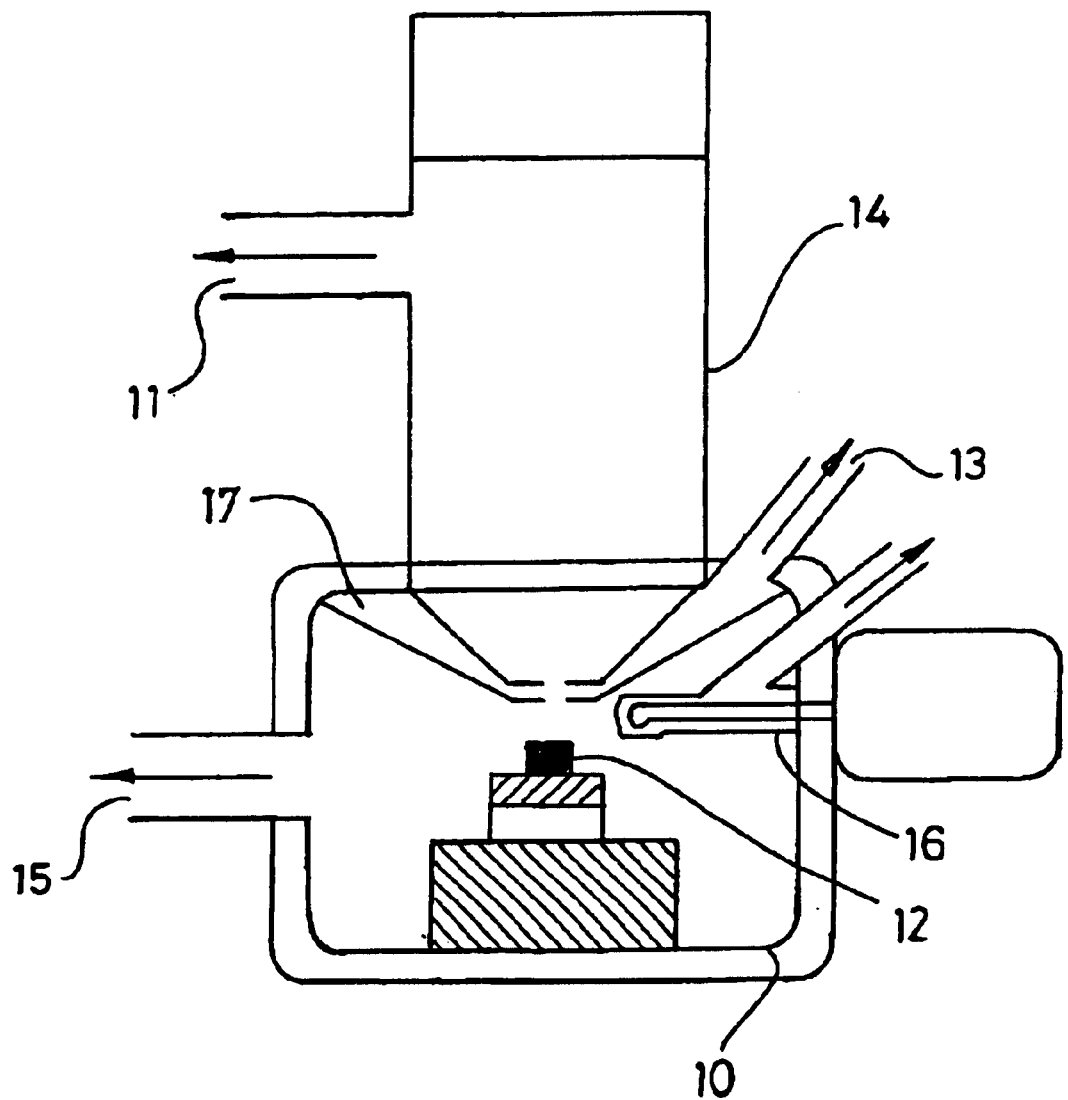
FIG. 1 is a schematic cut away view of an electron microscope and of detection apparatus in accordance with the invention.

The scanning electron microscope of FIG. 1 comprises a specimen chamber 10 for holding a specimen 12 in a gaseous environment, generating means 14 for generating a scanning beam of electrons and apparatus 16 for detecting secondary electron signals produced at the specimen by the interaction of the specimen and beam of electrons. Generating means 14 is provided with an outlet port 11 for connection to a pump for evacuating the generating means. Specimen chamber 10 contains an intermediate chamber 17 provided with a first differential outlet port 13 and is provided with a second differential outlet port 15. Intermediate chamber 17 and differential outlet ports 13 and 15 isolate the gaseous environment in the specimen chamber from the vacuum in the generating means.

Figure 2:
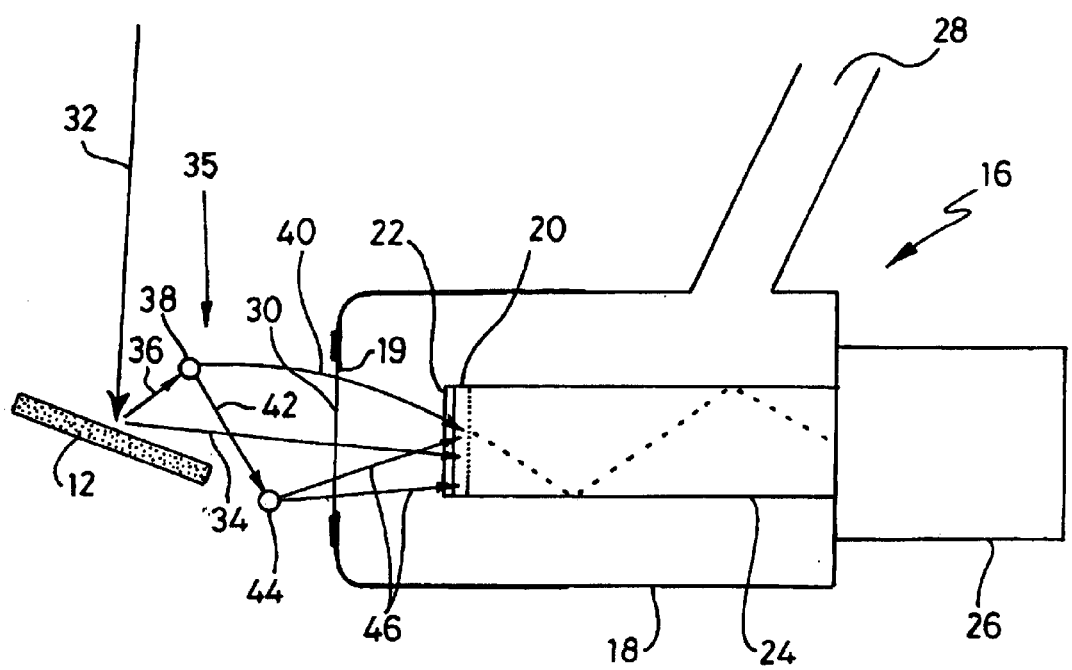
FIG. 2 is a schematic sectional view of the apparatus.

The generating means 14 is described in detail in, and illustrated in FIG. 2 of, PCT Application No. PCT/GB97/03136, which is incorporated herein by the above reference.

The working distance of the scanning electron microscope, that is the distance between the generating means 14 and the specimen 12, is 5 mm.

The specimen 12 and apparatus 16 are shown in detail in FIG. 2. Detecting apparatus 16 comprises a chamber 18 which seals an Everhard-Thornley detector from the gaseous environment of the specimen chamber and which has an outlet port 28 connected to a turbopump (not shown) for evacuating the chamber 18. The Everhard-Thornley detector comprises a transparent SnO layer 20 onto which is coated a scintillator 22. Light from the scintillator 22 is fed via a quartz light pipe 24 to photomultiplier 26.

The chamber 18 also has an inlet 19 which is sealed by an aluminium foil membrane 30, and is situated directly in front the scintillator 22.

The aluminium foil membrane 30 is approximately 7.5 nm thick. An equation for the approximate range of electrons of low energy in materials of low atomic weight has been derived by Kanaya and Okayama (Penetration and energy-loss theory of electrons in solid targets, J.Phys.D., 5, 43–58, 1972), this being $$\text{range} = 0.0276 A E_o^{1.67}/(Z^{0.889}\rho) \mu m$$

where $E_o$=energy of electrons (keV),
A=atomic weight,
$\rho$=density (g/cm$^3$),
Z=atomic number of the atoms constituting the material.

The range of electrons in pure aluminium varies according to the equation above from 0.6 nm at 100 eV to 28.2 nm at 1 keV. The aluminium foil membrane 30 is connected to a variable accelerating voltage source of up to +1 kV. Secondary electrons and avalanche-generated electrons are accelerated towards the aluminium foil by the field resulting from the accelerating voltage applied to the foil and the majority gain sufficient kinetic energy (of the order of 1 keV) to pass through the foil, which is approximately 7.5 nm thick, to enter the chamber 18. That voltage also causes gas amplification.

The scintillator 22 is connected to an accelerating voltage supply of approximately 10 kV. Electrons which pass through the foil are accelerated towards the scintillator 22 by which they are converted to photons. The scintillator 22 is connected to light pipe 24 which conducts the photons to the photomultiplier 26.

FIG. 2 also shows the process of gas amplification of a secondary electron signal, showing the scanning electron beam 32, the approximate location of a gas amplification collision zone, the path 36 of a secondary electron and the path 34 of a back-scattered electron. The collision zone 35 comprises a region of the specimen chamber between the sample 12 and the apparatus in which region the majority of collisions between electrons and gas molecules occur as a result of the electric field due to the accelerating voltage applied to the aluminium foil membrane. The path 36 of the secondary electron is shown intersecting with the path of a gas molecule 38, which as a result of the collision, releases electrons which follow paths 40 and 42. The electron following path 40 is accelerated towards the aluminium foil membrane, passes through the membrane and is accelerated towards the SnO layer and scintillator. Also, electrons released in the aluminium foil (not shown), by collision, are also accelerated towards the SnO layer and scintillator. The electron following path 42 is accelerated towards the aluminium foil but collides with gas molecule 44, which produces two electrons which follow similar paths 46 through the aluminium foil membrane into the chamber.

The aluminium foil membrane has a mylar™ backing (not shown) which enables the foil to withstand the pressure difference across it due to the gaseous environment outside the chamber and the substantial vacuum within. The aluminium foil membrane may alternatively be reinforced by a grid structure inside the chamber and across the inlet thereto.

Figure 3A:
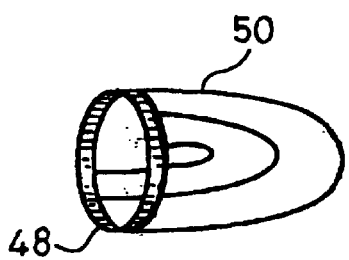
FIGS. 3a and 3b are views of electrically conductive cages for attachment to the apparatus.
Figure 3B:
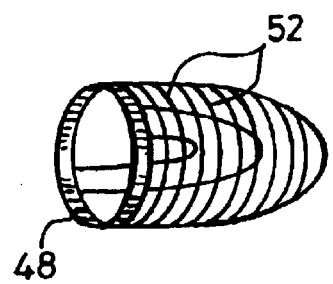

FIG. 3a shows a first design of the electrically conductive cage which may be mounted in front of, but electrically isolated from, the aluminium foil membrane. The second design comprises an annular connecting member 48 with a depth of 7 mm and a diameter of 25 mm to which are attached the open ends of three loops 50. The longest loop measures 30 mm from the curved end to the annular member 48. The cage shown in FIG. 3b is similarly constructed and has similar dimensions but the loops are reinforced by a number of hoops 52. The cages are connected in use to an accelerating voltage supply of +300 V which has the effect of drawing the gas amplification collision zone in the specimen chamber closer to the aluminium foil membrane, thereby improving the sensitivity of the apparatus.

Figure 4:
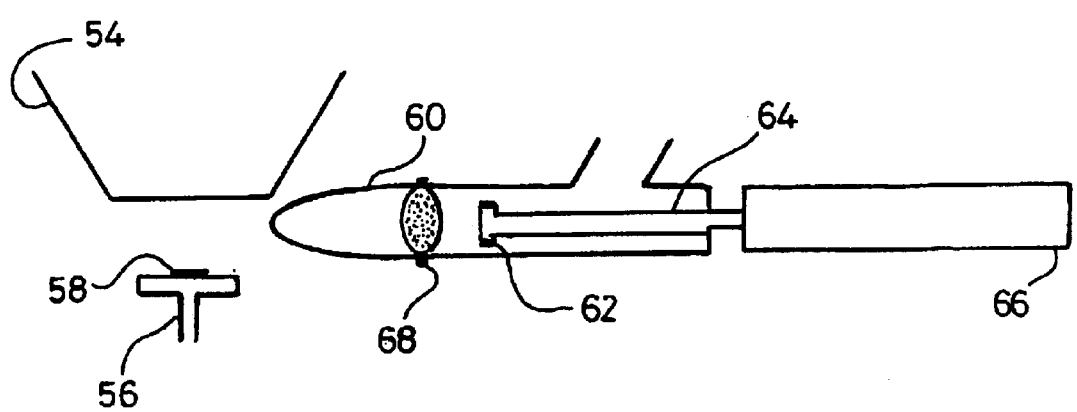
FIG. 4 is a schematic cut away view of detection apparatus in accordance with the invention with an electrically conductive cage attached thereto.

FIG. 4 shows apparatus with an electrically conductive cage 60 attached to the aluminium foil membrane 68. As in previous embodiments the apparatus comprises a scintillator 62, light pipe 64 and photomultiplier 66. Also shown are a source 54 of a primary electron beam and a stub 56 upon which a specimen 58 is held. The diameter of the stub is 12.5 mm and the stub is designed to accommodate a specimen measuring up to 5 mm at its widest point. The distance between the curved end of the electrically conductive cage, that is the point nearest to the specimen, and the specimen, is 5 mm.

What is claimed is:

1. Apparatus for detecting charged particles, the apparatus comprising a chamber for receiving said particles and being such that, in use, at least a partial vacuum is maintained in the chamber; an impact responsive sensor for detecting particles incident thereon, at least the part of the sensor on which the particles are incident being situated in the chamber; accelerating means for providing, in the chamber, an electric field for accelerating charged particles therein towards the sensor and electrically conductive barrier means sealing an inlet to the chamber to allow said partial vacuum to be maintained, the barrier means being sufficiently thin to enable the charged particles to be detected to travel therethrough, and being electrically isolated from the accelerating means so as to be capable of being maintained at a different potential from the latter.

2. Apparatus according to claim 1, in which the accelerating means comprises an electrically conductive member situated on or adjacent to the sensor, and a connector for connecting said member to an accelerating voltage.

3. Apparatus according to claim 2, in which the apparatus includes voltage application means for applying a first accelerating voltage to said electrically conductive member and a second accelerating voltage of the same polarity as, but lower than, the first accelerating voltage, to the barrier means.

4. Apparatus according to claim 3, in which the apparatus further includes an electrically conductive cage mounted in front of, but electrically insulated from, the barrier means, the cage being connectable to an accelerating voltage for drawing particles towards the barrier means, the cage being so constructed as to allow the passage of particles therethrough, and in which the voltage application means is also operable to apply to the cage a further voltage, of the same polarity as, but lower than, the second voltage.

5. Apparatus according to claim 1, in which the sensor comprises a scintillator for emitting light in response to the impact of a charged particle therewith.

6. Apparatus according to claim 5, in which the accelerating means comprises an electrically conductive member situated on or adjacent to the sensor, and a connector for connecting said member to an accelerating voltage, and in which the scintillator incorporates said electrically conductive member.

7. Apparatus according to claim 6, in which the sensor comprises an Everhart-Thornley detector.

8. Apparatus according to claim 1, in which the barrier means comprises a membrane of metallic foil.

9. Apparatus according to claim 8, in which the foil is of aluminium.

10. Apparatus according to claim 9, in which the aluminium foil is of a thickness of 7.5 nm.

11. Apparatus according to claim 8, in which the barrier means further comprises support means which extends across said inlet behind the foil to support the latter against pressure exerted on the membrane by gas outside the chamber.

12. Apparatus according to claim 1, in which the apparatus further includes an electrically conductive cage mounted in front of, but electrically insulated from, the barrier means, the cage being connectable to an accelerating voltage for drawing particles towards the barrier means, the cage being so constructed as to allow the passage of particles therethrough.

13. Apparatus according to claim 12, in which the cage is part-spherical or ellipsoidal.

14. Apparatus according to claim 1, in which the apparatus includes a pump connected to, and operable to evacuate, the chamber.

15. A scanning electron microscope having a sample chamber for holding a sample to be imaged in a gaseous environment, generating means for generating a scanning beam of electrons and directing said beam onto a sample in said sample chamber, wherein said chamber also contains detecting means for detecting secondary electrons emitted by the sample, said detecting means comprising apparatus according to claim 1.

16. A microscope according to claim 15, in which the accelerating means comprises an electrically conductive member situated on or adjacent to the sensor, and a connector for connecting said member to an accelerating voltage, wherein the electrically conductive member and barrier means are connected to a voltage application means for applying a voltage of +10 kV to the member and of 0 to +1 kV to the barrier means.

17. A method of detecting charged particles in a gaseous environment, the method comprising the steps of allowing or causing said particles to pass through an electrically conductive barrier means at the inlet to a chamber in which at least part of an impact responsive sensor is situated; accelerating particles in the chamber towards the sensor, by means of an electric field in the chamber, while maintaining the chamber at a lower pressure than said environment and maintaining the barrier means of a potential that at least reduces the intensity of electric field passing through the barrier means and into the environment, wherein the barrier means allows the passage of said particles whilst enabling the lower pressure to be maintained in the chamber.

18. A method according to claim 17, wherein the step of maintaining a lower pressure in the chamber is achieved by maintaining at least a partial vacuum in the chamber by means of a pump connected to an outlet of the chamber.

19. A method according to claim 17, further comprising the step of maintaining the barrier means at a different potential from that of accelerating means, for creating said electric field in the chamber.

* * * * *

UNITED STATES PATENT AND TRADEMARK OFFICE
CERTIFICATE OF CORRECTION

PATENT NO. : 6,781,124 B2
APPLICATION NO. : 09/927608
DATED : August 24, 2004
INVENTOR(S) : Armin Heinz Hayn It is certified that error appears in the above-identified patent and that said Letters Patent is hereby corrected as shown below:

The claims are replaced by claim 1-19 as shown below:

Col. 5, lines 20-34
1. Apparatus for detecting charged particles, the apparatus comprising a chamber for receiving said particles and being such that, in use, at least a partial vacuum is maintained in the chamber; an impact responsive sensor for detecting particles incident thereon, at least the part of the sensor on which the particles are incident being situated in the chamber; an accelerating electrode for providing, in the chamber, an electric field for accelerating charged particles therein towards the sensor and an electrically conductive barrier sealing an inlet to the chamber to allow said partial vacuum to be maintained, the baffler means being sufficiently thin to enable the charged particles to be detected to travel therethrough, and being electrically isolated from the accelerating electrode so as to be capable of being maintained at a different potential from the latter.

Col. 5 lines 35-38
2. Apparatus according to claim 1, in which the accelerating electrode comprises an electrically conductive member situated on or adjacent to the sensor, and a connector for connecting said member to an accelerating voltage.

Col. 5 lines 39-44
3. Apparatus according to claim 1, in which the sensor comprises a scintillator for emitting light in response to the impact of a charged particle therewith.

UNITED STATES PATENT AND TRADEMARK OFFICE
CERTIFICATE OF CORRECTION

PATENT NO. : 6,781,124 B2
APPLICATION NO. : 09/927608
DATED : August 24, 2004
INVENTOR(S) : Armin Heinz Hayn It is certified that error appears in the above-identified patent and that said Letters Patent is hereby corrected as shown below:

Col. 5 lines 45-52
4. Apparatus according to claim 3, in which the accelerating electrode comprises an electrically conductive member situated on or adjacent to the sensor, and a connector for connecting said member to an accelerating voltage, and in which the scintillator incorporates said accelerating electrode.

Col. 5 lines 53-55
5. Apparatus according to claim 4, in which the sensor comprises an Everhart-Thornley detector.

Col. 5 lines 56-61
6. Apparatus according to claim 1, in which the barrier comprises a membrane of metallic foil.

Col. 6 lines 1-2
7. Apparatus according to claim 6, in which the foil is of aluminium.

Col. 6 lines 3-4
8. Apparatus according to claim 7, in which the aluminium foil is of a thickness of 7.5nm.

Col. 6 lines 5-6
9. Apparatus according to claim 6, in which the barrier further comprises a support which extends across said inlet behind the foil to support the latter against pressure exerted on the membrane by gas outside the chamber.

UNITED STATES PATENT AND TRADEMARK OFFICE
CERTIFICATE OF CORRECTION

PATENT NO.          : 6,781,124 B2
APPLICATION NO. : 09/927608
DATED                  : August 24, 2004
INVENTOR(S)        : Armin Heinz Hayn It is certified that error appears in the above-identified patent and that said Letters Patent is hereby corrected as shown below:

Col. 6 lines 7-8
10. Apparatus according to claim 1, in which the apparatus further includes an electrically conductive cage mounted in front of, but electrically insulated from, the barrier, the cage being connectable to an accelerating voltage for drawing particles towards the barrier, the cage being so constructed as to allow the passage of particles therethrough.

Col. 6 lines 9-12
11. Apparatus according to claim 1, in which the apparatus includes a pump connected to, and operable to evacuate, the chamber.

Col. 6 lines 13-19
12. Apparatus according to claim 2, in which the apparatus includes a voltage source for applying a first accelerating voltage to said accelerating electrode and a second accelerating voltage of the same polarity as, but lower than, the first accelerating voltage, to the barrier.

Col. 6 lines 20-21
13. Apparatus according to claim 12, in which the apparatus further includes an electrically conductive cage mounted in front of, but electrically insulated from, the barrier, the cage being connectable to an accelerating voltage for drawing particles towards the barrier means, the cage being so constructed as to allow the passage of particles therethrough, and in which the voltage source is also operable to apply to the cage a further voltage, of the same polarity as, but lower than, the second voltage.

UNITED STATES PATENT AND TRADEMARK OFFICE
CERTIFICATE OF CORRECTION

| | | |
|---|---|---|
| PATENT NO. | : 6,781,124 B2 | Page 4 of 6 |
| APPLICATION NO. | : 09/927608 | |
| DATED | : August 24, 2004 | |
| INVENTOR(S) | : Armin Heinz Hayn | |

It is certified that error appears in the above-identified patent and that said Letters Patent is hereby corrected as shown below:

Col. 6 lines 22-23
14. Apparatus according to claim 10, in which the cage is part-spherical or ellipsoidal.

Col. 6 lines 24-31
15. A scanning electron microscope having a sample chamber for holding a sample to be imaged in a gaseous environment, an electron beam generator for generating a scanning beam of electrons and directing said beam onto a sample in said sample chamber, wherein said chamber also contains a detector for detecting secondary electrons emitted by the sample, said detector comprising apparatus according to claim 1.

Col. 6 lines 32-39
16. A microscope according to claim 15, in which the accelerating electrode comprises an electrically conductive member situated on or adjacent to the sensor, and a connector for connecting said member to an accelerating voltage, wherein the electrically conductive member and barrier means are connected to a voltage source for applying a voltage of +10 kV to the member and of 0 to +1 kV to the barrier means.

UNITED STATES PATENT AND TRADEMARK OFFICE
CERTIFICATE OF CORRECTION

| | | |
|---|---|---|
| PATENT NO. | : 6,781,124 B2 | |
| APPLICATION NO. | : 09/927608 | |
| DATED | : August 24, 2004 | |
| INVENTOR(S) | : Armin Heinz Hayn | |

It is certified that error appears in the above-identified patent and that said Letters Patent is hereby corrected as shown below:

Col. 6 lines 40-51
17. A method of detecting charged particles in a gaseous environment, the method comprising the steps of allowing or causing said particles to pass through an electrically conductive barrier at the inlet to a chamber in which at least part of an impact responsive sensor is situated; accelerating particles in the chamber towards the sensor, by means of an electric field in the chamber, while maintaining the chamber at a lower pressure than said environment and maintaining the barrier at a potential that at least reduces the intensity of electric field passing through the barrier and into the environment, wherein the barrier allows the passage of said particles whilst enabling the lower pressure to be maintained in the chamber.

Col. 6 lines 52-55
18. A method according to claim 17, wherein the step of maintaining a lower pressure in the chamber is achieved by maintaining at least a partial vacuum in the chamber by means of a pump connected to an outlet of the chamber.

UNITED STATES PATENT AND TRADEMARK OFFICE
CERTIFICATE OF CORRECTION

PATENT NO.         : 6,781,124 B2
APPLICATION NO. : 09/927608
DATED              : August 24, 2004
INVENTOR(S)        : Armin Heinz Hayn It is certified that error appears in the above-identified patent and that said Letters Patent is hereby corrected as shown below:

Col. 6 lines 56-59
19. A method according to claim 17, further comprising the step of maintaining the barrier at a different potential from that of an accelerating electrode, for creating said electric field in the chamber.

Signed and Sealed this

Eighteenth Day of September, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,781,124 B2 |
| APPLICATION NO. | : 09/927608 |
| DATED | : August 24, 2004 |
| INVENTOR(S) | : Armin Heinz Hayn |

It is certified that error appears in the above-identified patent and that said Letters Patent is hereby corrected as shown below:

The claims are replaced by claim 1-19 as shown below:

Col. 5, lines 20-34
1. Apparatus for detecting charged particles, the apparatus comprising a chamber for receiving said particles and being such that, in use, at least a partial vacuum is maintained in the chamber; an impact responsive sensor for detecting particles incident thereon, at least the part of the sensor on which the particles are incident being situated in the chamber; an accelerating electrode for providing, in the chamber, an electric field for accelerating charged particles therein towards the sensor and an electrically conductive barrier sealing an inlet to the chamber to allow said partial vacuum to be maintained, the barrier being sufficiently thin to enable the charged particles to be detected to travel therethrough, and being electrically isolated from the accelerating electrode so as to be capable of being maintained at a different potential from the latter.

Col. 5 lines 35-38
2. Apparatus according to claim 1, in which the accelerating electrode comprises an electrically conductive member situated on or adjacent to the sensor, and a connector for connecting said member to an accelerating voltage.

Col. 5 lines 39-44
3. Apparatus according to claim 1, in which the sensor comprises a scintillator for emitting light in response to the impact of a charged particle therewith.

UNITED STATES PATENT AND TRADEMARK OFFICE
CERTIFICATE OF CORRECTION

PATENT NO. : 6,781,124 B2
APPLICATION NO. : 09/927608
DATED : August 24, 2004
INVENTOR(S) : Armin Heinz Hayn It is certified that error appears in the above-identified patent and that said Letters Patent is hereby corrected as shown below:

Col. 5 lines 45-52
4. Apparatus according to claim 3, in which the accelerating electrode comprises an electrically conductive member situated on or adjacent to the sensor, and a connector for connecting said member to an accelerating voltage, and in which the scintillator incorporates said accelerating electrode.

Col. 5 lines 53-55
5. Apparatus according to claim 4, in which the sensor comprises an Everhart-Thornley detector.

Col. 5 lines 56-61
6. Apparatus according to claim 1, in which the barrier comprises a membrane of metallic foil.

Col. 6 lines 1-2
7. Apparatus according to claim 6, in which the foil is of aluminium.

Col. 6 lines 3-4
8. Apparatus according to claim 7, in which the aluminium foil is of a thickness of 7.5nm.

Col. 6 lines 5-6
9. Apparatus according to claim 6, in which the barrier further comprises a support which extends across said inlet behind the foil to support the latter against pressure exerted on the membrane by gas outside the chamber.

UNITED STATES PATENT AND TRADEMARK OFFICE
CERTIFICATE OF CORRECTION

PATENT NO.         : 6,781,124 B2
APPLICATION NO. : 09/927608
DATED                   : August 24, 2004
INVENTOR(S)        : Armin Heinz Hayn It is certified that error appears in the above-identified patent and that said Letters Patent is hereby corrected as shown below:

Col. 6 lines 7-8
10. Apparatus according to claim 1, in which the apparatus further includes an electrically conductive cage mounted in front of, but electrically insulated from, the barrier, the cage being connectable to an accelerating voltage for drawing particles towards the barrier, the cage being so constructed as to allow the passage of particles therethrough.

Col. 6 lines 9-12
11. Apparatus according to claim 1, in which the apparatus includes a pump connected to, and operable to evacuate, the chamber.

Col. 6 lines 13-19
12. Apparatus according to claim 2, in which the apparatus includes a voltage source for applying a first accelerating voltage to said accelerating electrode and a second accelerating voltage of the same polarity as, but lower than, the first accelerating voltage, to the barrier.

Col. 6 lines 20-21
13. Apparatus according to claim 12, in which the apparatus further includes an electrically conductive cage mounted in front of, but electrically insulated from, the barrier, the cage being connectable to an accelerating voltage for drawing particles towards the barrier, the cage being so constructed as to allow the passage of particles therethrough, and in which the voltage source is also operable to apply to the cage a further voltage, of the same polarity as, but lower than, the second voltage.

UNITED STATES PATENT AND TRADEMARK OFFICE
CERTIFICATE OF CORRECTION

PATENT NO. : 6,781,124 B2
APPLICATION NO. : 09/927608
DATED : August 24, 2004
INVENTOR(S) : Armin Heinz Hayn It is certified that error appears in the above-identified patent and that said Letters Patent is hereby corrected as shown below:

Col. 6 lines 22-23
14. Apparatus according to claim 10, in which the cage is part-spherical or ellipsoidal.

Col. 6 lines 24-31
15. A scanning electron microscope having a sample chamber for holding a sample to be imaged in a gaseous environment, an electron beam generator for generating a scanning beam of electrons and directing said beam onto a sample in said sample chamber, wherein said chamber also contains a detector for detecting secondary electrons emitted by the sample, said detector comprising apparatus according to claim 1.

Col. 6 lines 32-39
16. A microscope according to claim 15, in which the accelerating electrode comprises an electrically conductive member situated on or adjacent to the sensor, and a connector for connecting said member to an accelerating voltage, wherein the electrically conductive member and barrier are connected to a voltage source for applying a voltage of +10 kV to the member and of 0 to +1 kV to the barrier.

UNITED STATES PATENT AND TRADEMARK OFFICE
CERTIFICATE OF CORRECTION

| | | |
|---|---|---|
| PATENT NO. | : 6,781,124 B2 | |
| APPLICATION NO. | : 09/927608 | |
| DATED | : August 24, 2004 | |
| INVENTOR(S) | : Armin Heinz Hayn | |

It is certified that error appears in the above-identified patent and that said Letters Patent is hereby corrected as shown below:

Col. 6 lines 40-51
17. A method of detecting charged particles in a gaseous environment, the method comprising the steps of allowing or causing said particles to pass through an electrically conductive barrier at the inlet to a chamber in which at least part of an impact responsive sensor is situated; accelerating particles in the chamber towards the sensor, by means of an electric field in the chamber, while maintaining the chamber at a lower pressure than said environment and maintaining the barrier at a potential that at least reduces the intensity of electric field passing through the barrier and into the environment, wherein the barrier allows the passage of said particles whilst enabling the lower pressure to be maintained in the chamber.

Col. 6 lines 52-55
18. A method according to claim 17, wherein the step of maintaining a lower pressure in the chamber is achieved by maintaining at least a partial vacuum in the chamber by means of a pump connected to an outlet of the chamber.

UNITED STATES PATENT AND TRADEMARK OFFICE
CERTIFICATE OF CORRECTION

PATENT NO. : 6,781,124 B2
APPLICATION NO. : 09/927608
DATED : August 24, 2004
INVENTOR(S) : Armin Heinz Hayn It is certified that error appears in the above-identified patent and that said Letters Patent is hereby corrected as shown below:

Col. 6 lines 56-59
19. A method according to claim 17, further comprising the step of maintaining the barrier at a different potential from that of an accelerating electrode, for creating said electric field in the chamber.

This certificate supersedes the Certificate of Correction issued September 18, 2007.

Signed and Sealed this

Twenty-seventh Day of May, 2008

JON W. DUDAS
*Director of the United States Patent and Trademark Office*